US007123460B2

(12) United States Patent
Ajit (10) Patent No.: US 7,123,460 B2
(45) Date of Patent: Oct. 17, 2006

(54) METHODS AND SYSTEMS FOR REDUCING POWER-ON FAILURE OF INTEGRATED CIRCUITS (75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/993,484

(22) Filed: Nov. 22, 2004

(65) Prior Publication Data
US 2005/0088110 A1 Apr. 28, 2005

Related U.S. Application Data (63) Continuation of application No. 10/278,067, filed on Oct. 23, 2002, now Pat. No. 6,839,211.

(60) Provisional application No. 60/357,880, filed on Feb. 21, 2002.

(51) Int. Cl.
H02H 3/26 (2006.01)

(52) U.S. Cl. ...................................... 361/86

(58) Field of Classification Search ................. 361/86, 361/93.1; 307/86, 18, 19, 23, 29
See application file for complete search history.

(56) References Cited

U.S. PATENT DOCUMENTS

| 4,024,417 | A | | 5/1977 | Heuber et al. | |
|---|---|---|---|---|---|
| 4,360,847 | A | * | 11/1982 | Bloomer et al. | 361/3 |
| 4,713,716 | A | | 12/1987 | Takemura et al. | |
| 4,866,307 | A | * | 9/1989 | Ashmore, Jr. | 365/185.1 |
| 5,406,128 | A | | 4/1995 | Arinobu | |
| 5,408,147 | A | * | 4/1995 | Yarbrough et al. | 326/68 |
| 5,510,735 | A | * | 4/1996 | Mahabadi | 327/77 |
| 5,717,696 | A | | 2/1998 | Gabillard et al. | |
| 5,783,964 | A | * | 7/1998 | Eitan | 327/408 |
| 6,137,311 | A | | 10/2000 | Hedberg | |
| 6,160,430 | A | * | 12/2000 | Drapkin et al. | 327/143 |
| 6,657,833 | B1 | | 12/2003 | Matsuki et al. | |
| 6,671,816 | B1 | | 12/2003 | Woo | |
| 6,691,239 | B1 | * | 2/2004 | Rose | 713/330 |

FOREIGN PATENT DOCUMENTS

WO    WO 01/01216    1/2001

* cited by examiner

Primary Examiner—Stephen W. Jackson
Assistant Examiner—Zeev V. Kitov
(74) Attorney, Agent, or Firm—Sterne Kessler Goldstein & Fox PLLC (57) ABSTRACT Methods and systems for protecting integrated circuits from power-on sequence currents and for biasing transistors in paths susceptible to power-on sequence damage are provided. The system includes a plurality of protection circuits coupled between a first circuit input and a second circuit input. Each protection circuit includes a switch and a voltage sensors. When the voltage amplitude of a first voltage source coupled to the protection circuit exceeds a first threshold and the voltage amplitude of a second voltage source coupled to the protection circuit is below a second threshold, the switch is closed, coupling the first circuit input to the second circuit input. When the voltage amplitude of the first voltage source exceeds the first threshold and the voltage amplitude of the second voltage source exceeds the second threshold, the switch is open, decoupling the first circuit input from the second circuit input.

15 Claims, 9 Drawing Sheets

METHODS AND SYSTEMS FOR REDUCING POWER-ON FAILURE OF INTEGRATED CIRCUITS

CROSS-REFERENCE TO RELATED APPLICATIONS

This application is a continuation of U.S. application Ser. No. 10/278,067, filed Oct. 23, 2002, entitled "Methods and Systems for Reducing Power-On Failure of Integrated Circuit," (now U.S. Pat. No. 6,839,211) which claims priority to U.S. Provisional Application Ser. No. 60/357,880, filed Feb. 21, 2002, titled, "Methods and Systems for Reducing Power-On Failure of Integrated Circuits," each of which is incorporated herein by reference in its entirety.

BACKGROUND OF THE INVENTION

1. Field of the Invention

The present invention is directed to methods and systems for protecting integrated circuits ("ICs") from power-on sequence currents and, more particularly, to methods and systems for biasing transistors in paths susceptible to power-on sequencing damage such that these paths do not have substantial current flow unless the power supplies controlling the gate of the susceptible transistors are powered on.

2. Background Art

Circuit boards commonly use multiple power supplies. When the power supplies are powered on at different times, undesired currents tend to flow between the power supplies. These undesired currents are referred to herein as power-on sequence currents. Power-on sequence currents can damage integrated circuits ("ICs") on the circuit boards.

For example, core logic may be designed to operate at VDDC/VDDP (1.2V/1.5V/1.8V/2.5V) while an output driver may be required to operate at VDDP/VDDO (1.5V/1.8V/2.5V/3.3V). Voltage level shifting circuits are typically used to interface core signals to the output driver control signals. Voltage level shifting circuits may be designed to operate between two or more power supplies such as VDDO and VDDC. Gate-oxide portions of transistors in these level-shifting circuits may be able to withstand maximum of VDDO-VDDC across the gate-oxide portions.

When these ICs are put into system boards, the different power-supplies may be powered-on at different times. For instance, VDDO may be powered-on before VDDC. This can cause a voltage higher than VDDO-VDDC to appear across the gate-oxide of these transistors during the power-up, potentially damaging the gate-oxide.

Another situation that can cause problems is when I/O buffers require multiple level power supplies, such as 3.3V or 2.5V for example, to interface with other circuits. A number of different I/O buffer circuits may be designed on a chip. In such a design, I/O buffers are selected according to the input signal level or I/O supply voltage level. If the I/O pad voltage is powered up before the core supply voltage is powered up, the core supply voltage may not select a proper I/O buffer circuit. As a result, a higher I/O supply voltage may be inadvertently applied to thinner gate-oxide/shorter gate length I/O circuitry.

Problems similar to those described above can occur during transients and/or glitches on power supply lines.

Methods and systems are needed to protect circuits from over-voltage conditions across IC terminals during power-on sequences, and/or during transients and/or glitches on power supply lines during normal operations.

BRIEF SUMMARY OF THE INVENTION

The present invention is directed to methods and systems for protecting integrated circuits ("ICs") from power-on sequence voltages and currents. More particularly, the present invention is directed to methods and systems for biasing transistors in paths susceptible to power-on sequence damage such that these paths do not have substantial current flow unless the power supplies controlling the gate of the susceptible transistors are powered on.

In an embodiment, the invention is applied to a circuit having a first and second IC terminals coupled to a first and second power supplies, respectively. The invention protects the circuit in the event that the first power supply is powered-on before the second power supply is powered-on. The method includes sensing voltage amplitudes from the first and second power supplies. When first power supply is powered-on before the second power supply is powered-on, the first IC terminal is coupled to the second IC terminal. This substantially prevents undesired power-on sequence currents from flowing between the first and second IC terminals.

For example, in an embodiment, the circuit to be protected is a transistor, such as a PMOS or an NMOS transistor. The first and second IC terminals are coupled to a source and a gate of the transistor. When the source and gate are coupled together, there is little or no voltage across the source/gate junction. As a result, there is little or no power-on sequence current through the source/gate junction.

When the second power supply is powered-on, the first and second IC terminals are de-coupled and the circuit is allowed to operate normally. In an embodiment, the first and second IC terminals are also de-coupled when the first power supply is off. This conserves power.

In an embodiment, the first and second power supplies are measured against first and second thresholds, respectively. When the first voltage is above the first threshold and the second voltage is below the second threshold, the first and second IC terminals are coupled together. When the second voltage is above the second threshold, and/or when the first voltage is below the first threshold, the first and second IC terminals are de-coupled. In an embodiment, the first and second thresholds are set so that a difference between them is less than a maximum allowable voltage difference for the circuit that is being protected.

In an alternative embodiment, a difference between the first and second voltages is measured. When the difference exceeds a threshold, the first and second IC terminals are coupled to one another.

In an embodiment, the invention is implemented to protect a circuit that is powered by more than two power supplies. Separate thresholds can be utilized for each power supply.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein. The drawing in which an element first appears is typically indicated by the leftmost digit(s) in the corresponding reference number.

BRIEF DESCRIPTION OF THE DRAWINGS/FIGURES

The present invention will be described with reference to the accompanying drawings wherein.

DETAILED DESCRIPTION OF THE INVENTION

The present invention is directed to methods and systems for protecting integrated circuits ("ICs") from power-on sequence currents. More particularly, the present invention is directed to methods and systems for biasing transistors in paths susceptible to power-on sequencing damage such that these paths do not have substantial current flow unless the power supplies controlling the gate of the susceptible transistors are powered on.

Figure 1A:
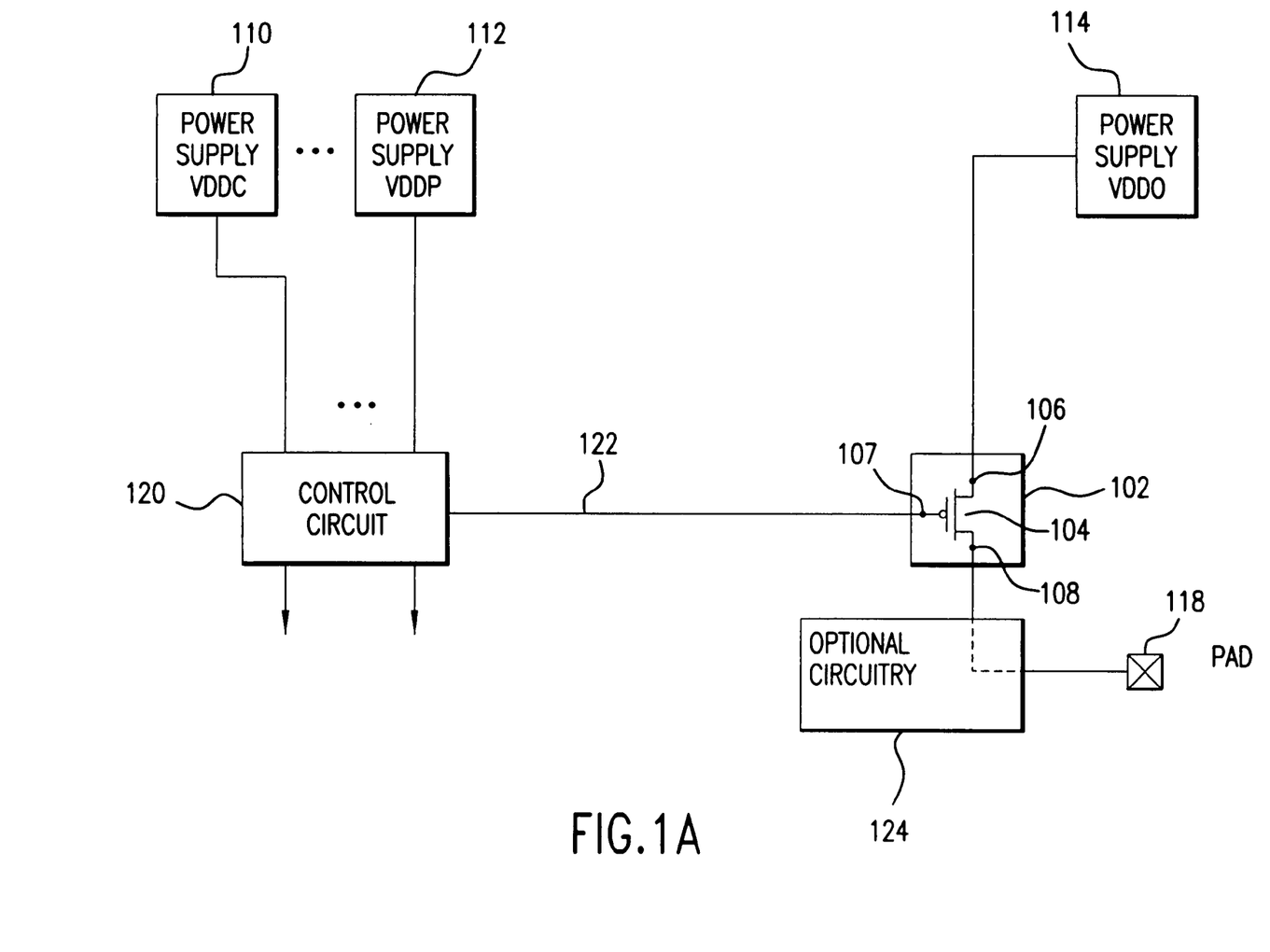
FIG. 1A illustrates an example environment for the present invention.

FIG. 1A illustrates an example environment for the present invention, including a circuit 102 controlled by a VDDO power supply 114 and by one or more additional power supplies, illustrated here as a VDDC power supply 110 and a VDDP power supply 112. The power supplies 110, 112, and 114 are coupled to the circuit 102 in any of a variety of ways. In the illustrated example, the power supply 114 is coupled directly to the circuit 102 and the power supplies 110 through 112 are coupled to the circuit 102 through a control circuit 120. The control circuit 120 selectively outputs a control signal 122 from one of the power supplies 110 through 112 to the circuit 102.

The circuit 102 includes any of a variety of circuit components. In the example of FIG. 1A, the circuit 102 includes a transistor 104 having a source terminal 106 coupled to the power supply 114, a gate terminal 107 coupled to the control circuit 120, and a drain terminal 108 coupled to an input/output ("I/O") terminal pad 118. The drain terminal 108 is coupled to the I/O pad 118 directly or through optional circuitry 124. The optional circuitry 124 can include, for example, one or more transistors that provide the I/O pad 118 with 5 volt tolerance. The control circuit 120 controls the transistor 104 through the gate terminal 107.

In the example of FIG. 1A, the transistor 102 is a PMOS driver transistor, implemented, for example, in a digital complimentary metal oxide semiconductor ("CMOS") I/O circuit environment. The present invention is not, however, limited to use with PMOS devices, driver devices, or digital CMOS I/O environments. As described below, the present invention can be implemented for any type of circuit 102, including, without limitation, NMOS and/or PMOS type of device(s).

In the example of FIG. 1A, the VDDO power supply 114 typically provides a voltage amplitude greater than voltage amplitudes provided by the VDDC power supply 110 and the VDDP power supply 112. Ideally, the VDDO power supply 114, the VDDC power supply 110, and the VDDP power supply 112 are powered on at the same time. In practice, however, this is difficult to achieve. For example, during power-on sequencing, power supply 114 may turn on before the VDDC power supply 110 and/or the VDDP power supply 112. When this happens, undesired power-on sequence currents tend to flow through the circuit 102. For example, where the circuit 102 includes the transistor 104, an undesired power-on sequence current may flow through a source/drain junction transistor of the transistor 104, or undesired voltages may exist across the source-to-gate (i.e., from the source terminal 106 to the gate terminal 107). Power-on sequence voltages and currents can damage the circuit 102.

Figure 1B:
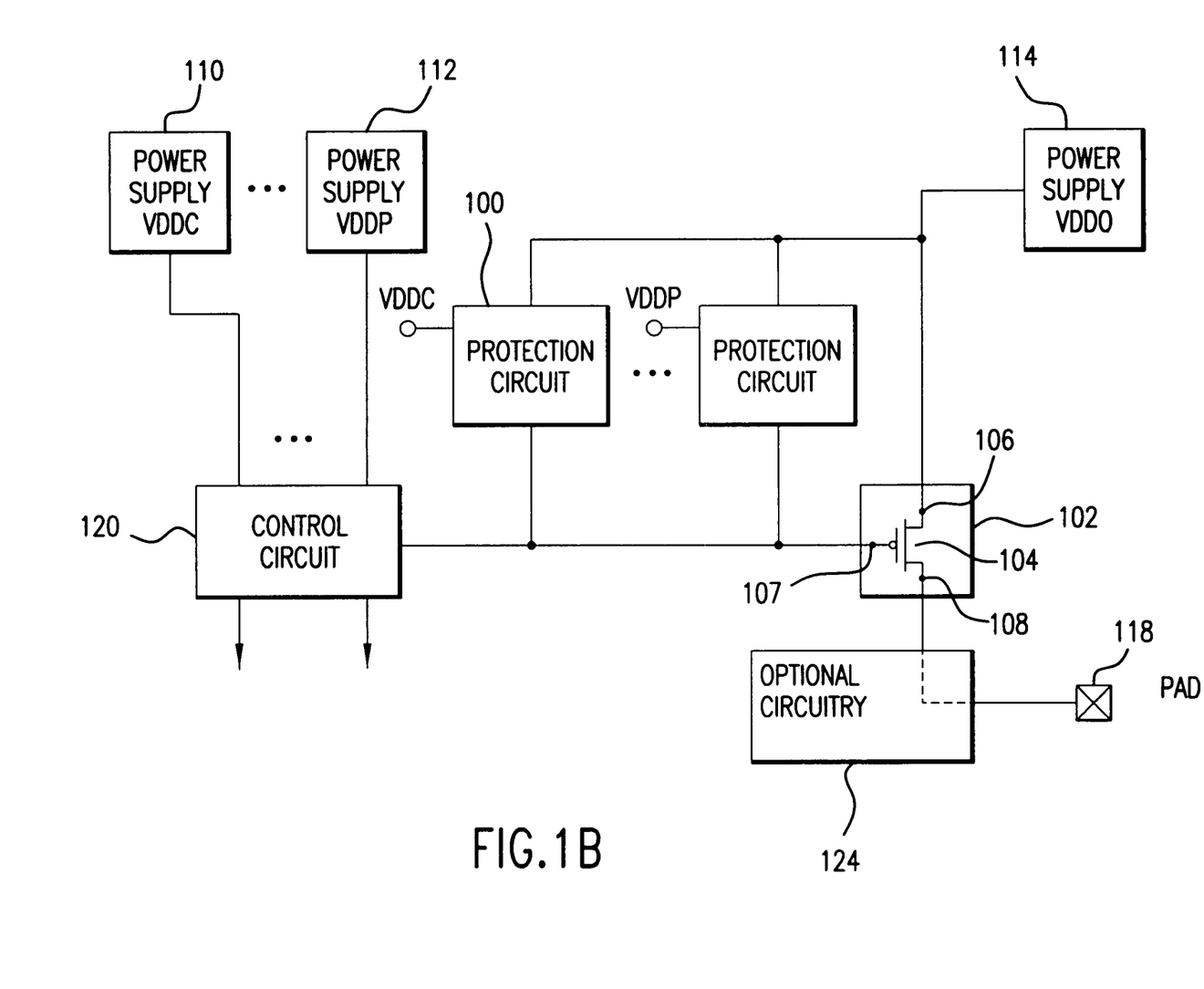
FIG. 1B illustrates the example environment of FIG. 1A, further including a plurality of protection circuits in accordance with an aspect of the present invention.

Referring to FIG. 1B, in accordance with the present invention, one or more protection circuits 100 are provided to protect the circuit 102 from power-on sequence currents. The one or more protection circuits 100 bias the circuit 102 such that the circuit 102 does not have substantial current flow unless the VDDC power supply 110 and the VDDP power supply 112 are powered on.

In an embodiment, a separate protection circuit 100 is provided for each of the power supplies that control the gate terminal 107 of the transistor 104, (e.g., the VDDC power supply 110 and the VDDP power supply 112). When the VDDO power supply 114 is powered-on and the VDDC power supply 110 and/or the VDDP power supply 112 are not powered-on, the transistor 104 is turned-on by coupling its source terminal 106 to its gate terminal 107 through the corresponding protection circuit 100. When the VDDO power supply 114 is on, and when the VDDC power supply 110 and the VDDP power supply 112 are powered-on, the one or more protection circuits 100 uncouple the source terminal 106 from the gate terminal 107. The circuit 100 substantially prevents undesired voltages across the source/gate junction of the transistor 104, which substantially prevents undesired power-on sequence currents through the transistor 104.

Figure 2A:
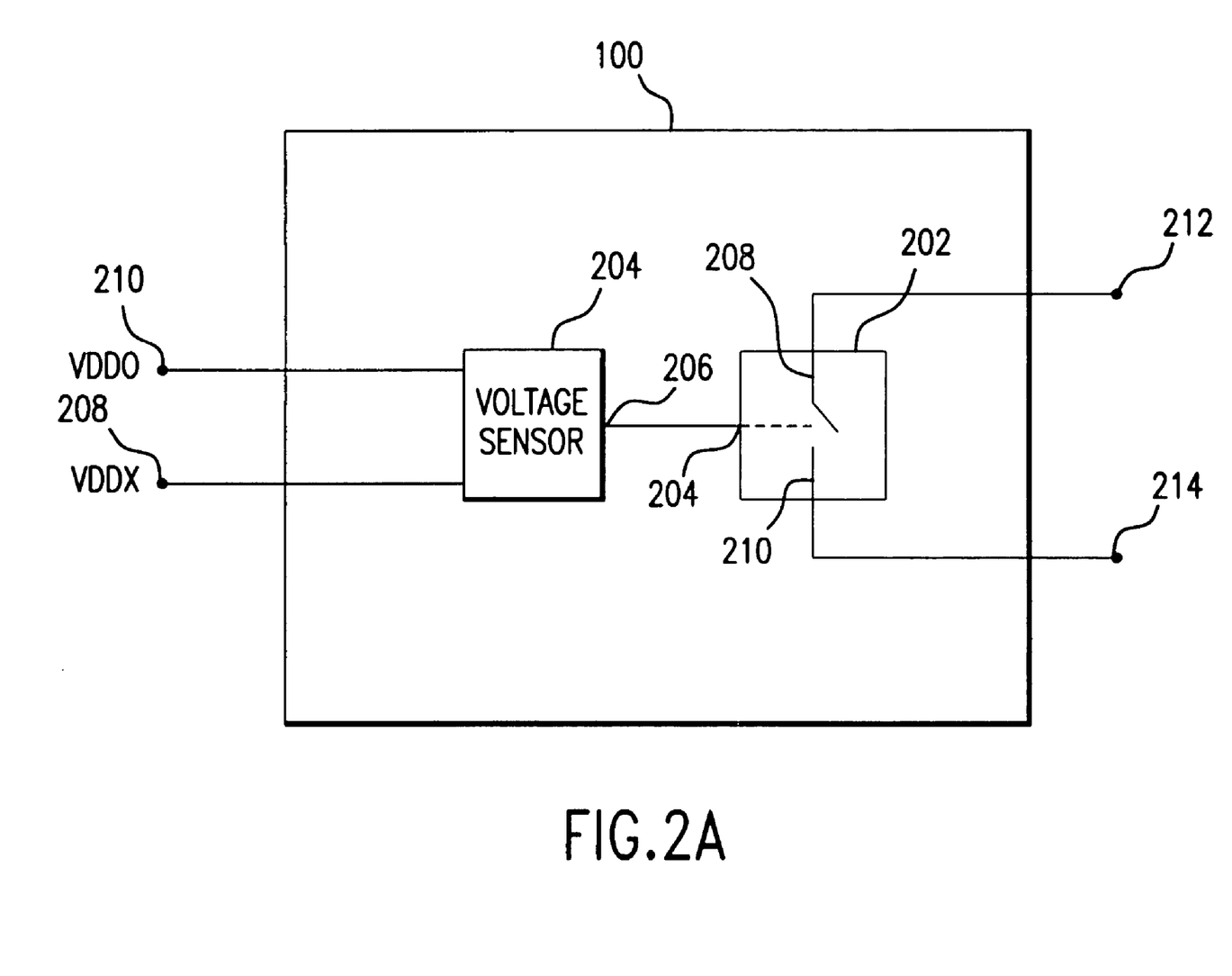
FIG. 2A is a high level block diagram of a protection circuit in accordance with an aspect of the present invention.

FIG. 2A is a high level block diagram of an example implementation of the protection circuit 100. In this example, the protection circuit 100 includes a voltage sensor 204 and two or more voltage sensing terminals, illustrated here as a VDDX sensing terminal 208 and a VDDO sensing terminal 210. The voltage sensor 204 senses voltage amplitudes at the VDDX sensing terminal 208 and at the VDDO sensing terminal 210. The protection circuit 100 further includes a switch 202 having a control input 204 coupled to an output 206 of the voltage sensor 204. The switch 202 further includes at least two contacts 208 and 210 coupled to first and second output terminals 212 and 214. The voltage sensor 204 controls the switch 202 to couple the first and second output terminals 212 and 214 together when the sensed voltages exceed one or more thresholds.

Figure 2B:
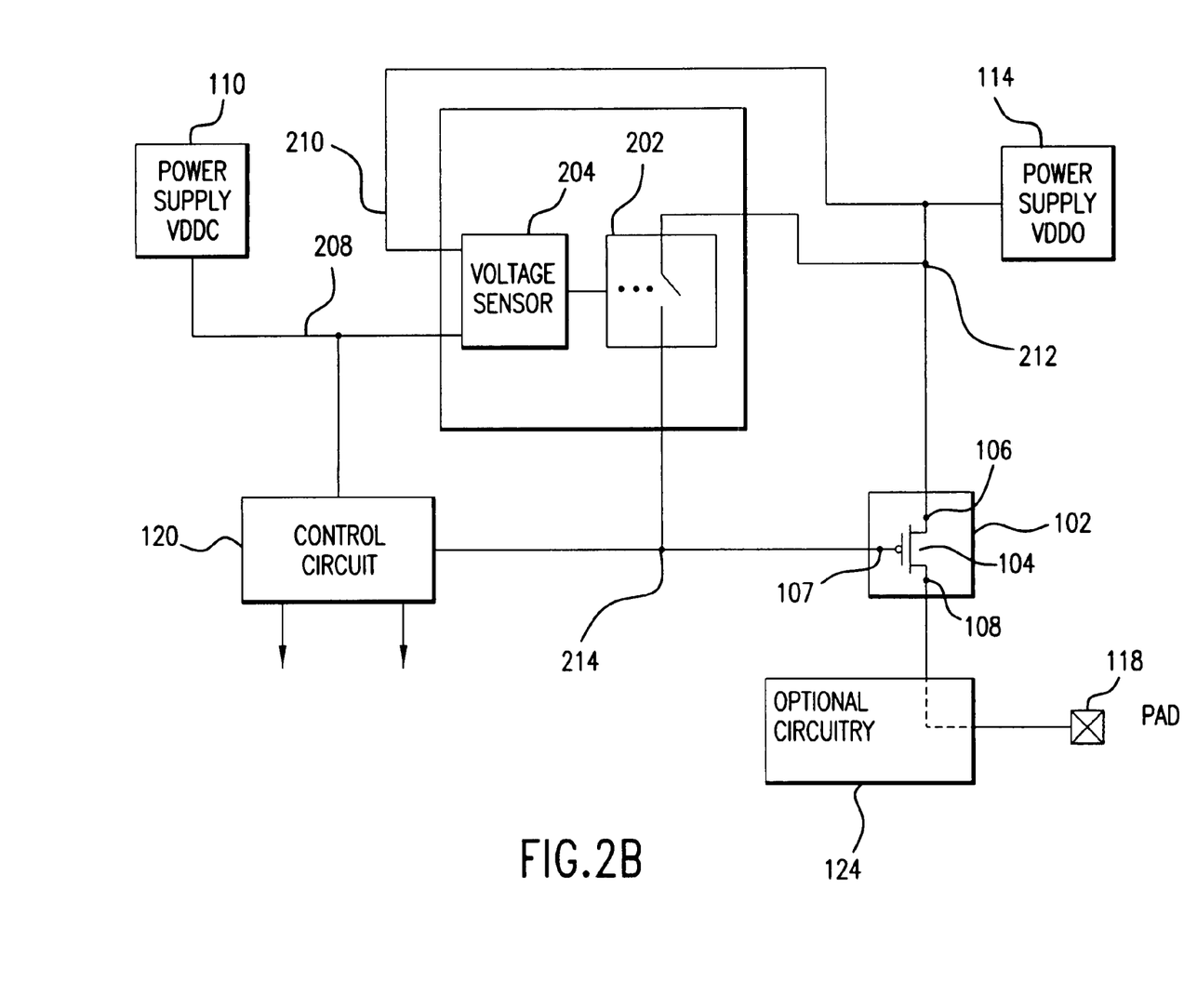
FIG. 2B is a block diagram of the protection circuit illustrated in FIG. 2A, implemented in the example environment illustrated in FIG. 1A.

FIG. 2B illustrates the example protection circuit 100 of FIG. 2A implemented in the example environment of FIG. 1B. In this example, the VDDO sensing terminal 210 is coupled to the output of the VDDO power supply 114, the first output terminal 212 is coupled to the source terminal 106 of the transistor 104, and the second output terminal 214 is coupled to the gate terminal 107 of the transistor 104. The VDDO sensing terminal 210 is thus effectively coupled to the output terminal 212. Furthermore, the VDDX sensing terminal 208 is coupled to the output of the VDDC voltage supply 110. The VDDX sensing terminal 208 is thus referred to interchangeably herein as a VDDC sensing terminal 208.

In operation, the voltage sensor 204 senses a VDDO voltage from the VDDO power supply 114, and a VDDC voltage from the VDDC power supply 110. When the voltage sensor 204 determines that the VDDO power supply 114 is powered-on and the VDDC power supply 110 is off, the voltage sensor 204 controls the switch 202 to couple the source terminal 106 to the gate terminal 107. This substantially prevents a voltage across the source/gate junction of the transistor 104, which substantially prevents power-on sequence currents from flowing through the source/drain junction.

The voltage sensor 204 can be designed to operate in a variety of ways. In an exemplary embodiment, the voltage sensor 204 includes a first threshold associated with the VDDO sensing terminal 210, and a second threshold associated with the VDDC sensing terminal 208. When the VDDO voltage from the VDDO power supply 114 exceeds the first threshold and the VDDC voltage from the VDDC power supply 110 is below the second threshold, the voltage sensor 204 controls the switch 202 to couple the first output terminal 212 to the second output terminal 214. Alternatively, or additionally, the voltage sensor 204 is designed to sense a difference between the VDDO sensing terminal 210 and the VDDC sensing terminal 208. Optionally, a separate protection circuit 100 is provided for each of the one or more powers supplies 110–112.

In an embodiment, the protection circuit 100 is powered by the VDDO voltage sensed at the VDDO sensing terminal 210. This conserves power by enabling the protection circuit 100 only when the VDDO power supply 114 is powered-on.

Figure 3:
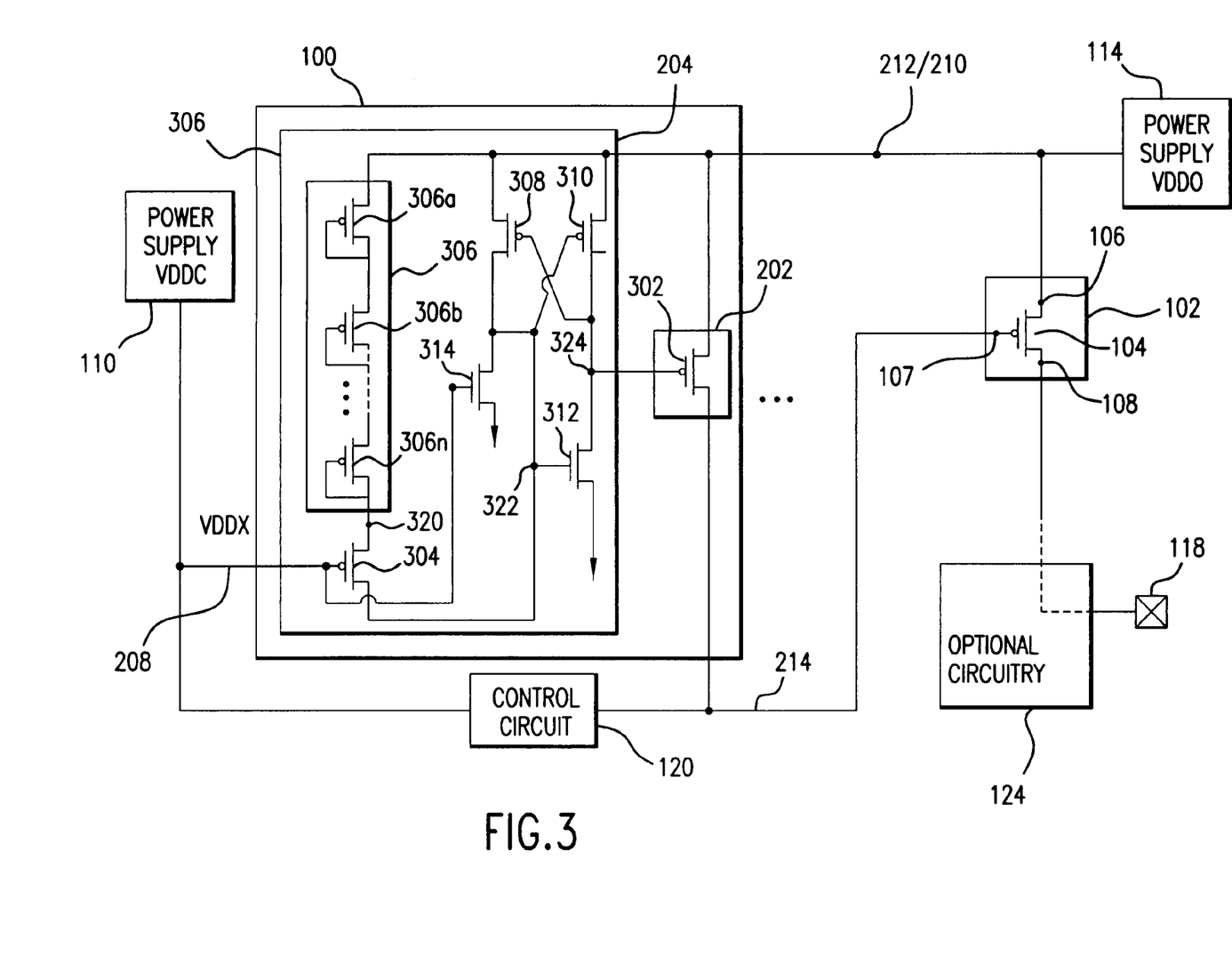
FIG. 3 illustrates an example schematic diagram of a protection circuit in accordance with an aspect of the present invention.

FIG. 3 illustrates an example schematic diagram of the protection circuit 100, wherein the switch 202 is implemented as a PMOS transistor 302, and the voltage sensor 204 is implemented with a combination of PMOS transistors 304–310 and NMOS transistors 312 and 314. The PMOS transistor 302 is biased to turn on when a voltage amplitude at the VDDX terminal 208 is below the first threshold and a voltage amplitude at the VDDO terminal 210 is above the second threshold. The bias for the PMOS transistor 302 is provided by the voltage sensor 204, as described below.

In the example of FIG. 3, the protection circuit 100 includes an optional voltage reducer 306, illustrated here as a series of diode-connected PMOS transistors 306a through 306n, within the voltage sensor 204. The voltage reducer 306 receives the voltage VDDO from the VDDO sensing terminal 210 and provides a reduced voltage at a node 320. The amplitude of the voltage at the node 320 is determined by the amplitude of the voltage at the VDDO sensing terminal 210 and by the number and/or type of diode-connected PMOS transistors 306a through 306n. The number and/or type of diode-connected PMOS transistors 306a through 306b are selected so as to reduce the VDDO voltage to a level within specifications of the PMOS transistor 304. Alternatively, the node 320 is coupled directly to the VDDO sensing terminal 210.

The bias for turning on the PMOS transistor 302 is now described. When the voltage at the VDDO sensing terminal 210 is above a threshold of the PMOS transistor 304 (i.e., the second threshold), for example, when the power supply 110 is off, the PMOS transistor 304 turns on and the NMOS transistor 314 turns off. When the PMOS transistor 304 turns on and the NMOS transistor 314 turns off, the voltage at the node 320 is provided to a node 322. The node 322 is coupled to a gate of the NMOS transistor 312. When the voltage amplitude at the gate of the NMOS transistor 312 rises above a threshold of the NMOS transistor 312 (i.e., the first threshold), for example, when the power supply 114 is turned on, the NMOS transistor 312 turns on. When the NMOS transistor 312 turns on, a node 324 is coupled to a low potential, illustrated here as ground. This turns on the PMOS transistor 302, which couples the first and second output terminals 212 and 214 together.

The protection circuit 100 illustrated in FIG. 3 further includes pull-up and pull-down circuitry, which is now described. When the node 324 is coupled to the low potential as described above, the PMOS 308 is turned on, which couples the node 322 to the VDDO sensing terminal 210. This further biases the node 322, and thus the gate of the NMOS transistor 312, to a relatively high potential. When the node 322 is at a relatively high potential, the PMOS transistor 310 turns off, which isolates the VDDO sensing terminal 210 from the node 324, insuring a relatively low potential at the node 324.

The bias for turning off the PMOS transistor 302 is now described. When the voltage at the VDDX sensing terminal 208 is above the threshold of the PMOS transistor 304 (i.e., the first threshold), for example, when power supply 110 is on, the PMOS transistor 304 turns off and the NMOS transistor 314 turns on. When the PMOS transistor 304 turns off and the NMOS transistor 314 turns on, the node 320 is isolated from the node 322 and node 322 is coupled to a relatively low potential, illustrated here as ground, through the NMOS transistor 314. When the voltage amplitude at the node 322, and thus at the gate of the NMOS transistor 312, falls below the threshold of the NMOS transistor 312 (i.e., the first threshold), the NMOS transistor 312 turns off. When the NMOS transistor 312 turns off, the node 324 is isolated from ground. When the voltage amplitude at the node 322 goes low, the PMOS transistor 310 turns on and couples the node 324 to the VDDO sensing terminal 110. This turns off the PMOS transistor 302, which disconnects the first output terminal 212 from the second output terminal 214.

When the VDDO power supply 114 is off, the protection circuit 100 is effectively disabled, even when the VDDC power supply 110 is off. This is because, when the voltage at the VDDO sensing terminal 210 is low, the voltage at the node 320 will not rise high enough to cause the voltage at the node 322 to rise above the first threshold of the NMOS transistor 312. The NMOS transistor 312 thus will not turn on and will not couple the gate of the PMOS transistor 302 to ground. The PMOS transistor 302 will thus not turn on and will not couple the first output terminal 212 to the second output terminal 214.

Figure 4A:
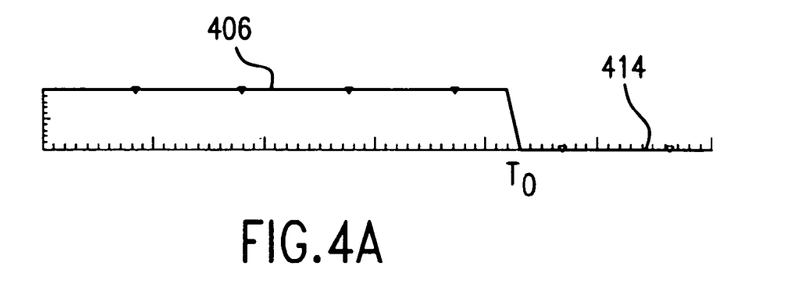
FIG. 4A illustrates an example timing diagram in accordance with an aspect of the present invention.
Figure 4B:
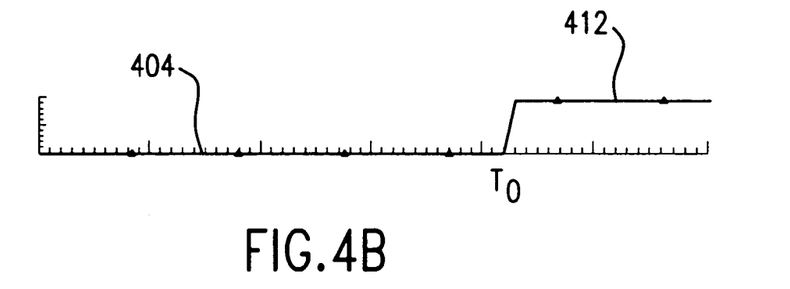
FIG. 4B illustrates another example timing diagram in accordance with an aspect of the present invention.
Figure 4C:
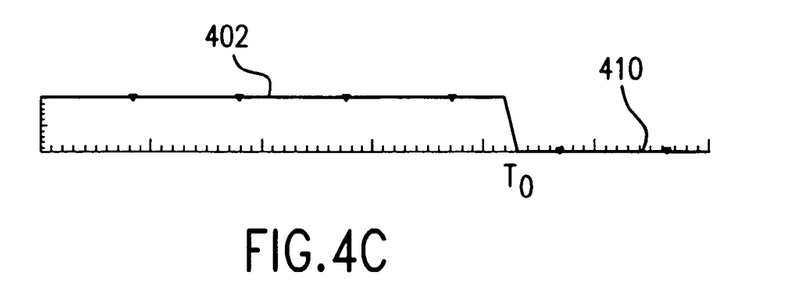
FIG. 4C illustrates another example timing diagram in accordance with an aspect of the present invention.
Figure 4D:
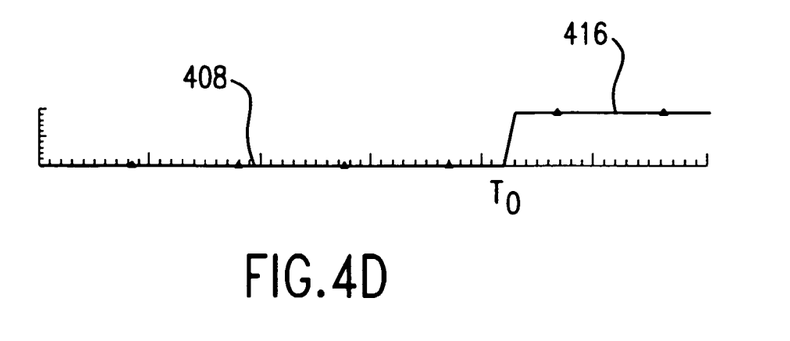
FIG. 4D illustrates another example timing diagram in accordance with an aspect of the present invention.

FIGS. 4A through 4D illustrate example timing diagrams for the protection circuit 100 illustrated in FIG. 3. More particularly, FIG. 4A illustrates an example timing diagram for the gate terminal 107 of the transistor 104, FIG. 4B illustrates an example timing diagram for the gate terminal of the PMOS transistor 302, FIG. 4C illustrates an example timing diagram for the gate terminal of the NMOS transistor 312, and FIG. 4D illustrates an example timing diagram for the pad 118. In the example timing diagrams of FIGS. 4A–4D, the VDDO power supply 114 is powered-on and the VDDC power supply 110 transitions from off to on at a time $T_0$.

FIGS. 4A–4D are now described with reference to FIG. 3. Prior to time $T_0$, while the power supply VDDC 110 is off, there is a relatively high voltage signal 402 (FIG. 4C) at the gate of the NMOS transistor 312, as described above, which causes a relatively low voltage signal 404 (FIG. 4B) at the gate of the PMOS transistor 302. This couples the source terminal 106 to the gate terminal 107. Since the source terminal 106 is coupled to the VDDO power supply 114, which is powered-on, a relatively high voltage signal 406 (FIG. 4A) is present at the gate 107, which disables the transistor 104. As a result, the pad 118 is de-coupled from VDDO. The pad voltage goes to a low value 408 (FIG. 4D) if there is a pull-down path (e.g., pull-down resistor) enabled at the pad.

After time $T_0$, when the power supply VDDC 110 is powered-on, there is a relatively low voltage signal 410 (FIG. 4C) at the gate of the NMOS transistor 312, which causes a relatively high voltage signal 412 (FIG. 4B) at the gate of the PMOS transistor 302. This uncouples the source terminal 106 from the gate terminal 107, which allows the control circuit 120 to control the transistor 104. For example, when the control circuit 120 outputs a relatively low voltage signal 414 (FIG. 4A) to the gate terminal 107, the PMOS transistor 104 outputs a relatively high voltage signal 416 (FIG. 4D) from its drain terminal 108 to the pad 118.

Based on the description herein, one skilled in the relevant art(s) will understand that other configurations are possible. Such other configurations are within the spirit and scope of the present invention In FIGS. 1B–3, the protection circuit 100 protect a PMOS transistor (i.e., PMOS transistor 104) from power-on sequence currents. Alternatively, or additionally, a complimentary protection circuit protects NMOS transistors within the circuit 102, depending on the nature of the power supplies used. For example, if the power supplies 110, 112, and 114 are positive with respect to ground, the protection circuit for PMOS transistors is used. If the supplies 110–112, and 114 are negative with respect to ground, a protection circuit for NMOS transistors is used. If the power supplies 110–112, and 114 include power supplies that are positive with respect to ground and power supplies that are negative with respect to ground, protection circuits for both PMOS and NMOS transistors are used. Based on the description herein, one skilled in the relevant art(s) will understand how to configure the protection circuit 100 for NMOS transistors. Such other configurations are within the scope and spirit of the present invention.

Figure 5:
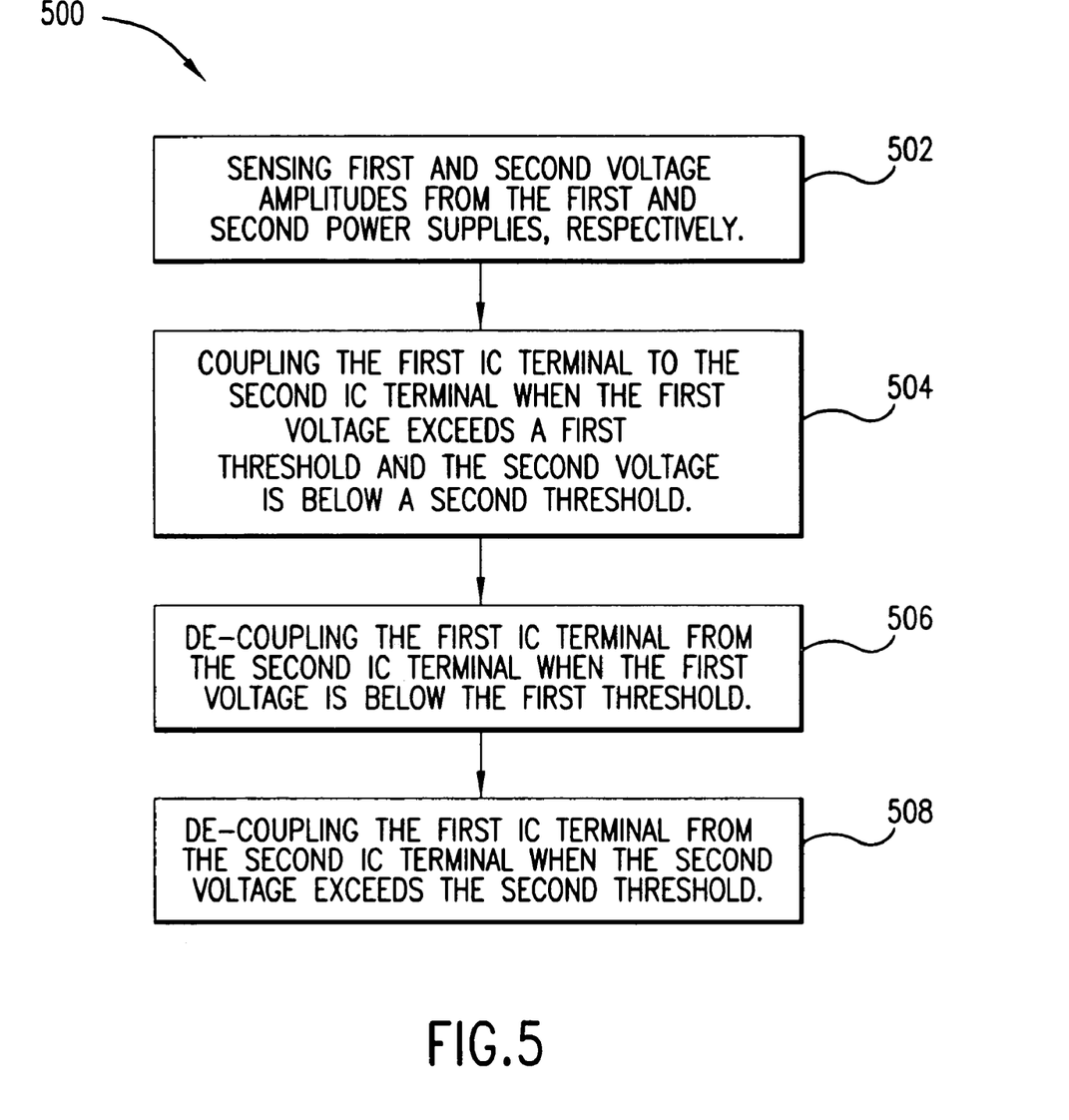
FIG. 5 illustrates a process flowchart for implementing the present invention.

FIG. 5 is a process flowchart 500 illustrating a method for protecting a circuit from power-on sequence currents, in accordance with the present invention. The process flowchart 500 describes the method in terms of a circuit to be protected having a first IC terminal coupled to a first power supply and a second IC terminal coupled to a control circuit, wherein the control circuit is coupled to a second power supply. For illustrative purposes, the process flowchart 500 is described with reference to one or more of the previous drawing figures. For example, in FIG. 1B, the circuit to be protected is the transistor 104, the first IC terminal is the source terminal 106, the first power supply is the VDDO power supply 113, the second IC terminal is the gate terminal 107, the control circuit is the control circuit 120, and the second power supply is the VDDC power supply 110. The process flowchart 500 is not, however, limited to examples illustrated in the previous drawing figures.

The process begins at step 502, which includes sensing first and second voltage amplitudes from the first and second power supplies, respectively. For example, in FIG. 2B, the voltage sensor 204 senses a first voltage level from the VDDO power supply 114 and a second voltage level from the VDDC power supply 110.

Step 504 includes coupling the first IC terminal to the second IC terminal when the first voltage exceeds a first threshold and the second voltage is below a second threshold. For example, in FIG. 2B, the voltage sensor 204 controls the switch 202 to couple the source terminal 106 to the gate terminal 107 when the VDDO voltage is powered-on (i.e., above the first threshold), and the VDDC voltage is off (i.e., below the second threshold). In FIG. 3, the first threshold is defined, at least in part, by the NMOS transistor 312. The second threshold is defined, at least in part, by the PMOS transistor 304 and the NMOS transistor 314. Generally, the first and second thresholds are determined so that a difference between them is less than a maximum allowable voltage difference between the first and second IC terminals (e.g., less than a maximum allowable voltage difference between source and gain terminals 106 and 107).

Step 506 includes de-coupling the first IC terminal from the second IC terminal when the first voltage is below the first threshold. For example, in FIG. 2B, the voltage sensor 204 controls the switch 202 to de-couple the source terminal 106 from the gate terminal 107 when the VDDO voltage is off, regardless of the level of the VDDC voltage. In FIG. 3, when the VDDO voltage is below the first threshold, the NMOS transistor 312 turns off and isolates the gate of the PMOS transistor 302 from ground. This turns off the PMOS transistor 302, which de-couples the source terminal 106 from the gate terminal 107.

Step 508 includes de-coupling the first IC terminal from the second IC terminal when the second voltage exceeds the second threshold. For example, in FIG. 2B, the voltage sensor 204 controls the switch 202 to de-couple the source terminal 106 from the gate terminal 107 when the VDDO voltage is powered-on (i.e., above the first threshold), and the VDDC voltage is powered-on (i.e., above the second threshold). In FIG. 3, the first threshold is defined, at least in part, by the NMOS transistor 312. The second threshold is defined, at least in part, by the PMOS transistor 304 and the NMOS transistor 314.

Where additional power supplies are implemented (e.g., VDDP power supply 112), steps 502 through 506 are performed in parallel for each additional power supply. In an embodiment, the second threshold is the same for the VDDC power supply 110 and the VDDP power supply 112. Alternatively, a different second threshold is used for each of the VDDC power supply 110 and the VDDP power supply 112. In this embodiment, step 508 includes de-coupling the first IC terminal from the second IC terminal only when both the VDDC power supply 110 and the VDDP power supply 112 are powered-on (above their respective second thresholds).

Figure 6:
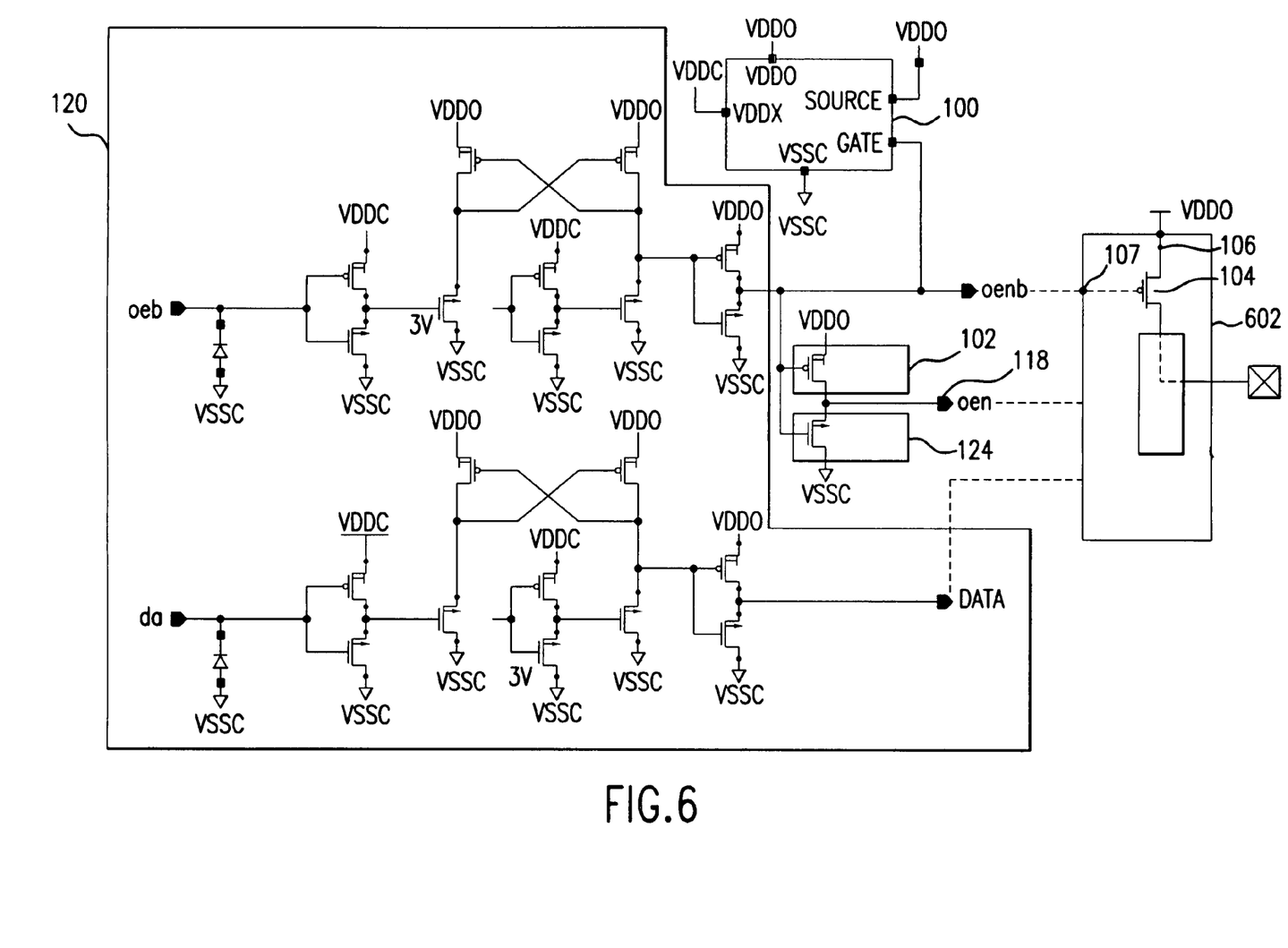
FIG. 6 illustrates an example schematic diagram in accordance with an aspect of the present invention.

FIG. 6 illustrates an example schematic diagram for the circuit 102, the control circuit 120, and the optional circuitry 124, wherein the circuit 102 provides a tri-stated output enable signal at the pad 118. In the example of FIG. 6, signals "oeb" and "oenb" are low to enable an output block 602. When VDDC is powered-off, signal "oenb" goes high, which disables the output block 602.

Figure 7:
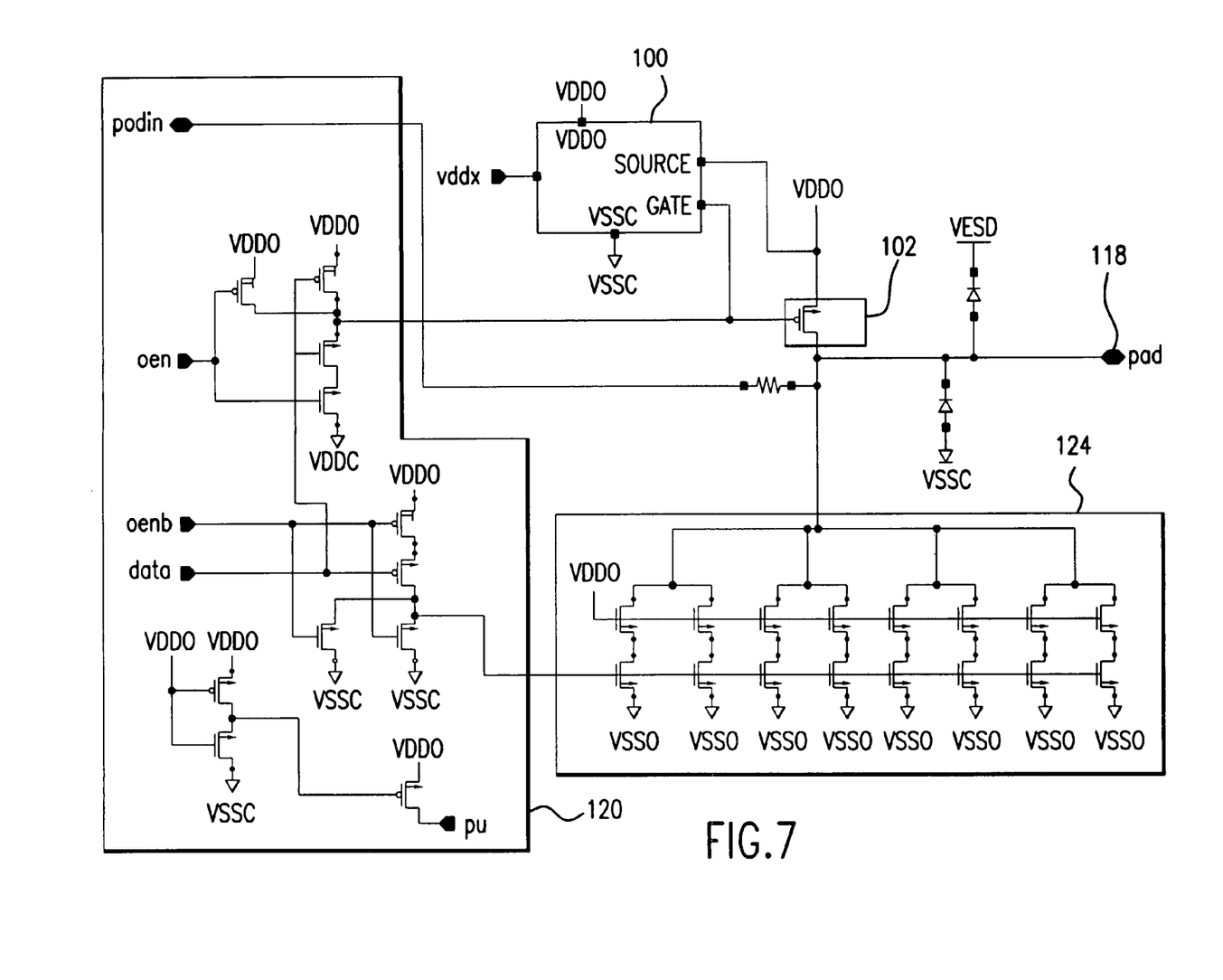
FIG. 7 illustrates another example schematic diagram in accordance with an aspect of the present invention.

FIG. 7 illustrates another example schematic diagram for the circuit 102, the control circuit 120, and the optional circuitry 124. The invention is not, however, limited to the examples provided herein.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for protecting a circuit from power-on sequence currents, wherein the circuit has a first and a second input, the method comprising:
   sensing a difference between a first voltage amplitude associated with a first voltage source and a second voltage amplitude associated with a second voltage source;
   coupling the first circuit input to the second circuit input when the difference between the first voltage amplitude and the second voltage amplitude indicates the first voltage source is powered-on and the second voltage source is off; and
   decoupling the first circuit input from the second circuit input when the difference between the first voltage amplitude and the second voltage amplitude indicates the first voltage source is powered-on and the second voltage source is powered-on,
   wherein the first voltage source is coupled to the first circuit input and the second voltage source is coupled to the second circuit input when the first voltage source is powered-on and the second voltage source is powered-on.

2. A system for protecting a circuit from power-on sequence currents, comprising:
   a circuit having a first circuit input and a second circuit input;
   a first voltage source coupled to the first circuit input;
   a first protection circuit coupled between the first circuit input and the second circuit input, wherein the first protection circuit includes:
      a first switch coupled at a first end to the first circuit input and at a second end to the second circuit input, and
      a first voltage sensor coupled to the first switch, wherein the first voltage sensor is further coupled to the first voltage source and a second voltage source, wherein the first voltage sensor causes the first switch to close when the first voltage source has a voltage amplitude above a first threshold and the second voltage source has a voltage amplitude below a second threshold, and
      wherein the first voltage sensor causes the first switch to open when the first voltage source has a voltage amplitude above the first threshold and the second voltage source has a voltage amplitude above the second threshold; and
   a second protection circuit coupled between the first circuit input and the second circuit input, wherein the second protection circuit includes:
      a second switch coupled at a first end to the first circuit input and at a second end to the second circuit input, and
      a second voltage sensor coupled to the switch, wherein the second voltage sensor is coupled to the first voltage source and a third voltage source,
      wherein the second voltage sensor causes the second switch to close when the first voltage source has a voltage amplitude above a first threshold and the second voltage source has a voltage amplitude below a third threshold, and
      wherein the second voltage sensor causes the second switch to open when the first voltage source has a voltage amplitude above the first threshold and the third voltage source has a voltage amplitude above the third threshold.

3. The system of claim 2, wherein the value of the second threshold equals the value of the third threshold.

4. The system of claim 2, wherein the first voltage sensor comprises:
   a first transistor having a gate coupled to the second voltage source and a drain coupled to a first node;
   a second transistor having a source coupled to the first node, a gate coupled to the second voltage source, and a drain coupled to a relatively low voltage potential;
   a third transistor having a gate coupled to the first node, a source coupled to the first switch, and a drain coupled to the relatively low voltage potential;
   a fourth transistor having a source terminal coupled to the first voltage source, a drain coupled to the first node, and a gate coupled to the first switch; and
   a fifth transistor having a source coupled to the first voltage source, a gate coupled to the first node, and a drain coupled to the first switch.

5. The system of claim 4, wherein the first voltage sensor further comprises:
   a first voltage reducer coupled between a source of the first transistor and the first voltage source.

6. The system of claim 4, wherein the first, fourth and fifth transistors are PMOS transistors.

7. The system of claim 6, wherein the second and third transistors are NMOS transistors.

8. The system of claim 5, wherein the first voltage reducer comprises a plurality of diode-connected transistors coupled in series between the source of the first transistor and the first voltage source.

9. The system of claim 2, wherein the second voltage sensor comprises:
   a sixth transistor having a gate coupled to the third voltage source and a drain coupled to a second node;
   a seventh transistor having a source coupled to the second node, a gate coupled to the third voltage source, and a drain coupled to a relatively low voltage potential;
   a eighth transistor having a gate coupled to the second node, a source coupled to the second switch, and a drain coupled to the relatively low voltage potential;

a ninth transistor having a source terminal coupled to the first voltage source, a drain coupled to the second node, and a gate coupled to the second switch; and a tenth transistor having a source coupled to the first voltage source, a gate coupled to the second node, and a drain coupled to the second switch.

10. The system of claim 9, wherein the second voltage sensor further comprises:

a second voltage reducer coupled to a source of the sixth transistor and the first voltage source.

11. The system of claim 9, wherein the sixth, ninth and tenth transistors are PMOS transistors.

12. The system of claim 11, wherein the seventh and eighth transistors are NMOS transistors.

13. The system of claim 12, wherein the second voltage reducer comprises a plurality of diode-connected transistors coupled in series between the source of the first transistor and the first voltage source.

14. The system of claim 2, further comprising a control circuit coupled to the second voltage source, the third voltage source, and the second circuit input.

15. The system of claim 14, wherein the control circuit selectively outputs a control signal from one of the second voltage source and the third voltage source to the circuit.

* * * * *

UNITED STATES PATENT AND TRADEMARK OFFICE
CERTIFICATE OF CORRECTION

PATENT NO. : 7,123,460 B2 Page 1 of 1
APPLICATION NO. : 10/993484
DATED : October 17, 2006
INVENTOR(S) : Janardhanan S. Ajit It is certified that error appears in the above-identified patent and that said Letters Patent is hereby corrected as shown below:

TITLE PAGE, ITEM (56)
Under "Other Publications", please list the following citations:

--European Search Report, Cited in EP 03709159, dated February 11, 2005, 3pp.--.

Signed and Sealed this

Ninth Day of January, 2007

JON W. DUDAS
*Director of the United States Patent and Trademark Office*